(12) United States Patent
Kim et al.

(10) Patent No.: US 12,035,608 B2
(45) Date of Patent: Jul. 9, 2024

(54) FOLDABLE DISPLAY DEVICE AND MANUFACTURING METHOD THEREOF

(71) Applicant: Samsung Display Co., Ltd., Yongin-si (KR)

(72) Inventors: Sanghoon Kim, Hwaseong-si (KR); Minhoon Choi, Seoul (KR); Dohoon Kim, Suwon-si (KR); Seongjin Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 176 days.

(21) Appl. No.: 16/561,840

(22) Filed: Sep. 5, 2019

(65) Prior Publication Data

US 2020/0136067 A1    Apr. 30, 2020

(30) Foreign Application Priority Data

Oct. 26, 2018 (KR) .................. 10-2018-0128786
Apr. 29, 2019 (KR) .................. 10-2019-0049854

(51) Int. Cl.
*B32B 7/12* (2006.01)
*H04M 1/02* (2006.01)
(Continued)

(52) U.S. Cl.
CPC .............. *H10K 77/111* (2023.02); *B32B 7/12* (2013.01); *H04M 1/0268* (2013.01);
(Continued)

(58) Field of Classification Search
CPC ............ H01L 51/0097; H01L 27/3244; H01L 51/524; H01L 51/5253; H01L 51/5271; H01L 51/5284; H01L 51/529; H01L 51/56; B32B 7/12
USPC ........................................................ 257/40
See application file for complete search history.

(56) References Cited

U.S. PATENT DOCUMENTS 10,586,941 B2    3/2020   Lee et al.
2014/0029212 A1   1/2014   Hwang et al.
(Continued)

FOREIGN PATENT DOCUMENTS

CN    1323258 A    11/2001
CN    1848861 A    10/2006
(Continued)

OTHER PUBLICATIONS

Chinese Office Action dated Sep. 2, 2022, including Search Report dated Aug. 29, 2022, for Application No. 201911016249.0, 10 pages.

*Primary Examiner* — Ori Nadav

(74) *Attorney, Agent, or Firm* — Lewis Roca Rothgerber Christie LLP

(57) ABSTRACT

A foldable display device is capable of improving a strength of a folding area and substantially reducing or minimizing a dead space of a non-folding area. The foldable display device includes: a display panel including a folding area and a non-folding area, and having a front surface and a back surface that are opposite each other; a window adjacent the front surface of the display panel; an auxiliary layer adjacent the back surface of the display panel; a first adhesive layer between the display panel and the window; and a second adhesive layer between the display panel and the auxiliary layer. A width of the window at the folding area is greater than a width of the window at the non-folding area.

19 Claims, 6 Drawing Sheets

(51) Int. Cl.
*H10K 50/84* (2023.01)
*H10K 50/844* (2023.01)
*H10K 50/856* (2023.01)
*H10K 50/86* (2023.01)
*H10K 50/87* (2023.01)
*H10K 59/12* (2023.01)
*H10K 71/00* (2023.01)
*H10K 77/10* (2023.01)
*H10K 102/00* (2023.01)

(52) U.S. Cl.
CPC ......... *H10K 50/841* (2023.02); *H10K 50/844* (2023.02); *H10K 50/856* (2023.02); *H10K 50/865* (2023.02); *H10K 50/87* (2023.02); *H10K 59/12* (2023.02); *H10K 71/00* (2023.02); *B32B 2457/20* (2013.01); *H10K 71/851* (2023.02); *H10K 2102/311* (2023.02)

(56) References Cited

U.S. PATENT DOCUMENTS

| | | |
|---|---|---|
| 2015/0062028 A1 | 3/2015 | Go et al. |
| 2015/0147532 A1* | 5/2015 | Nam ................. B32B 27/08 428/172 |
| 2015/0266272 A1* | 9/2015 | Lee .................. B32B 37/1284 428/189 |
| 2015/0268697 A1* | 9/2015 | Nam ................. B32B 7/02 428/157 |
| 2015/0331965 A1 | 11/2015 | Eschbach et al. |
| 2016/0306476 A1* | 10/2016 | Ko .................. G06F 3/0416 |
| 2017/0023829 A1* | 1/2017 | Im .................. G02F 1/133351 |
| 2017/0123461 A1* | 5/2017 | Kim ................. H05K 5/03 |
| 2017/0200915 A1* | 7/2017 | Lee .................. H05K 1/028 |
| 2017/0373121 A1* | 12/2017 | Leng ................. G09G 3/20 |
| 2018/0371196 A1 | 12/2018 | Park et al. |

FOREIGN PATENT DOCUMENTS

| | | |
|---|---|---|
| CN | 102183858 A | 9/2011 |
| CN | 104680941 B | 6/2015 |
| CN | 106910823 A | 6/2017 |
| CN | 106960849 A | 7/2017 |
| CN | 108122502 B | 6/2018 |
| EP | 3136158 A1 | 3/2017 |
| KR | 10-2015-0108991 A | 10/2015 |
| KR | 10-2017-0068823 A | 6/2017 |
| KR | 10-2017-0084402 A | 7/2017 |
| KR | 10-2017-0122554 A | 11/2017 |
| KR | 10-2018-0053483 A | 5/2018 |

\* cited by examiner

FOLDABLE DISPLAY DEVICE AND MANUFACTURING METHOD THEREOF

CROSS-REFERENCE TO RELATED APPLICATION

This application claims priority to and the benefit of Korean Patent Application No. 10-2018-0128786, filed on Oct. 26, 2018, and Korean Patent Application No. 10-2019-0049854, filed on Apr. 29, 2019, in the Korean Intellectual Property Office (KIPO), the disclosures of both of which are incorporated by reference herein in their entireties.

BACKGROUND

1. Field

Embodiments of the present invention relate to a foldable display device and to a method of manufacturing the foldable display device.

2. Discussion of Related Art

Display devices display various images on the display screen to provide information to the user. Recently, flexible display devices that can be bent are being developed. Dissimilar to flat panel display ("FPD") devices, flexible display devices can be folded or rolled like paper. The flexible display devices whose shape may be changed variously are easy to carry and may improve the convenience of the user. The flexible display devices may be classified into rollable display devices, foldable display devices, and the like.

It is to be understood that this background section is intended to provide useful background for understanding the technology and as such disclosed herein, such that the background section may include ideas, concepts or recognitions that were not part of what was known or appreciated by those skilled in the pertinent art prior to a corresponding effective filing date of the subject matter disclosed herein.

SUMMARY

An aspect according to embodiments of the present invention may be directed toward a foldable display device capable of improving a strength of a folding area and substantially reducing or minimizing a dead space of a non-folding area.

According to an embodiment, a foldable display device includes: a display panel including a folding area and a non-folding area, the display panel having a front surface and a back surface; a window adjacent the front surface of the display panel; an auxiliary layer adjacent the back surface of the display panel; a first adhesive layer between the display panel and the window; and a second adhesive layer between the display panel and the auxiliary layer. A width of the window at the folding area is greater than a width of the window at the non-folding area.

A breaking strength at the folding area may be greater than a breaking strength at the non-folding area.

The breaking strength at the folding area may be in a range from about 1 Gpa to about 100 Gpa, and the breaking strength at the non-folding area may be in a range from about 100 MPa to about 1 Gpa.

The foldable display device may further include two opposite side surfaces that are perpendicular to a folding axis and opposite each other. The two opposite side surfaces at the folding area may be uncut surfaces, and the opposite side surfaces at the non-folding area may be cut surfaces.

At least one side surface of the two opposite side surfaces at the folding area may have a step difference (e.g., may not be a flat surface or may not be a smooth surface).

The two opposite side surfaces at the non-folding area may be flat surfaces.

Respective widths of the display panel, the window, the auxiliary layer, the first adhesive layer, and the second adhesive layer at the non-folding area may be substantially equal to each other.

The opposite side surfaces at the non-folding area may be curved surfaces.

The foldable display device may further include a reinforcing member disposed at the cut surfaces.

The reinforcing member may not contact the uncut surfaces.

The window may be a tempered glass having a thickness in a range from about 10 μm to about 100 μm.

The auxiliary layer may be any one of a protective film, a light blocking film, a reflective film, and a heat dissipation film.

According to an embodiment, a foldable display device includes: a display panel including a folding area and a non-folding area, the display panel having a front surface and a back surface that are opposite each other; a window adjacent the front surface of the display panel; an auxiliary layer adjacent the back surface of the display panel; a first adhesive layer between the display panel and the window; and a second adhesive layer between the display panel and the auxiliary layer. The window includes two opposite side surfaces that are perpendicular to a folding axis and opposite each other, and the two opposite side surfaces at the folding area are uncut surfaces, and the two opposite side surfaces at the non-folding area are cut surfaces.

A width of the window at the folding area may be greater than a width of the window at the non-folding area.

A breaking strength at the folding area may be greater than a breaking strength at the non-folding area.

The breaking strength at the folding area may be in a range from about 1 Gpa to about 100 Gpa, and the breaking strength at the non-folding area may be in a range from about 100 MPa to about 1 Gpa.

The window may be a tempered glass having a thickness in a range from about 10 μm to about 100 μm.

According to an embodiment, a method of manufacturing a foldable display device includes: preparing a display panel that includes a folding area and a non-folding area, the display panel having a front surface and a back surface opposite each other; coupling a window on the front surface of the display panel and coupling an auxiliary layer on the back surface of the display panel; and concurrently cutting the display panel, the window, and the auxiliary layer that are located at the non-folding area. A width of the window at the folding area is greater than a width of the window at the non-folding area.

When concurrently cutting the display panel, the window, and the auxiliary layer that are located at the non-folding area, the display panel, the window, and the auxiliary layer that are located at the folding area may not be cut.

The method may further include placing a reinforcing member at cut surfaces of the display panel, the window, and the auxiliary layer.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the present invention will become more apparent by describing in more detail embodiments thereof with reference to the accompanying drawings, wherein.

DETAILED DESCRIPTION

Figure 1:
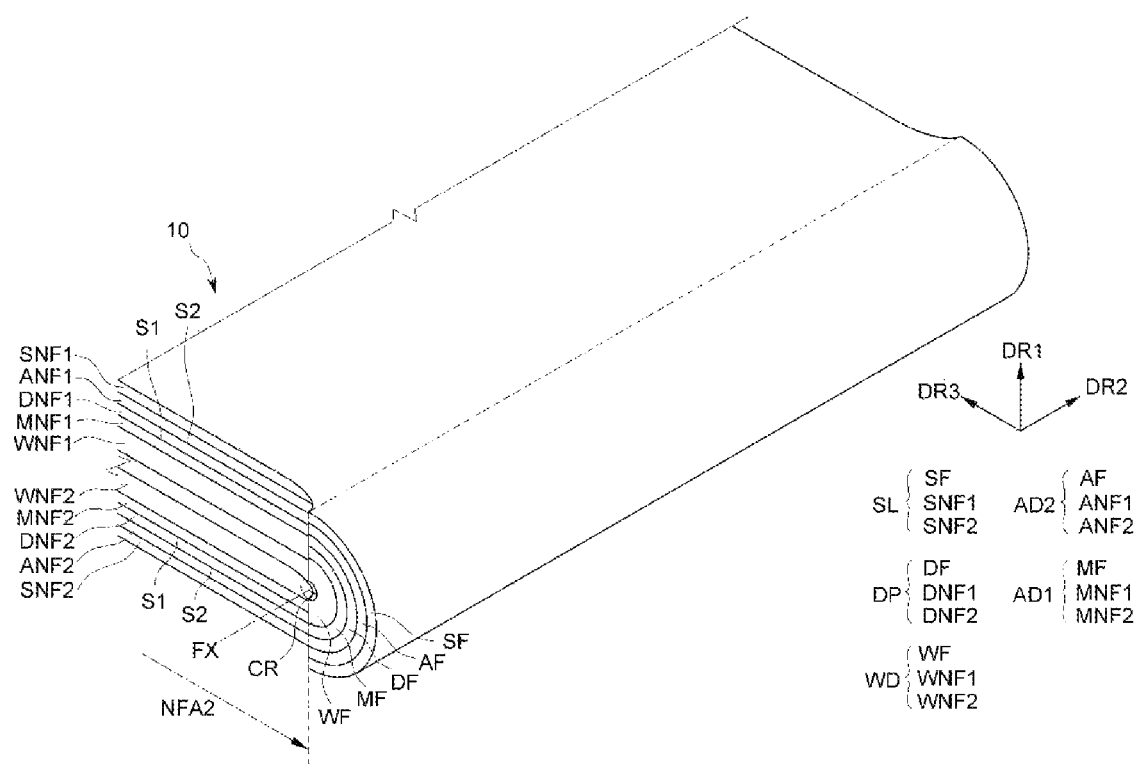
FIG. 1 is a schematic perspective view illustrating a foldable display device according to an embodiment in a folded state.

Embodiments will now be described more fully hereinafter with reference to the accompanying drawings. Although the invention may be modified in various manners and have several embodiments, embodiments illustrated in the accompanying drawings will be mainly described in the specification. However, the scope of the present invention is not limited to the embodiments and should be construed as including all the changes, equivalents and substitutions included in the spirit and scope of the present invention.

In the drawings, thicknesses of a plurality of layers and areas are illustrated in an enlarged manner for clarity and ease of description thereof. When a layer, area, element, or plate is referred to as being "on" another layer, area, element, or plate, it may be directly on the other layer, area, element, or plate, or intervening layers, areas, elements, or plates may be present therebetween. Conversely, when a layer, area, element, or plate is referred to as being "directly on" another layer, area, element, or plate, no intervening layers, areas, elements, or plates may be present. Further, when a layer, area, element, or plate is referred to as being "below" another layer, area, element, or plate, it may be directly below the other layer, area, element, or plate, or intervening layers, areas, elements, or plates may be present therebetween. Conversely, when a layer, area, element, or plate is referred to as being "directly below" another layer, area, element, or plate, no intervening layers, areas, elements, or plates may be present.

The spatially relative terms "below", "beneath", "lower", "above", "upper" and the like, may be used herein for ease of description to describe the relations between one element and another element as illustrated in the drawings. It will be understood that the spatially relative terms are intended to encompass different orientations of the device in use or operation, in addition to the orientation illustrated in the drawings. For example, in a case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or groups, but do not preclude the presence or addition of one or more other features, integers, steps, operations, elements, and/or groups.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

The term "about," "approximately," and similar terms as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, or 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description of the inventive concept may not be provided in order to specifically describe embodiments of the present invention. Like reference numerals refer to like elements throughout the specification. Expressions such as "at least one of," when preceding a list of elements, modify the entire list of elements and do not modify the individual elements of the list.

Hereinafter, an embodiment will be described with reference to FIGS. 1-5.

Figure 2:
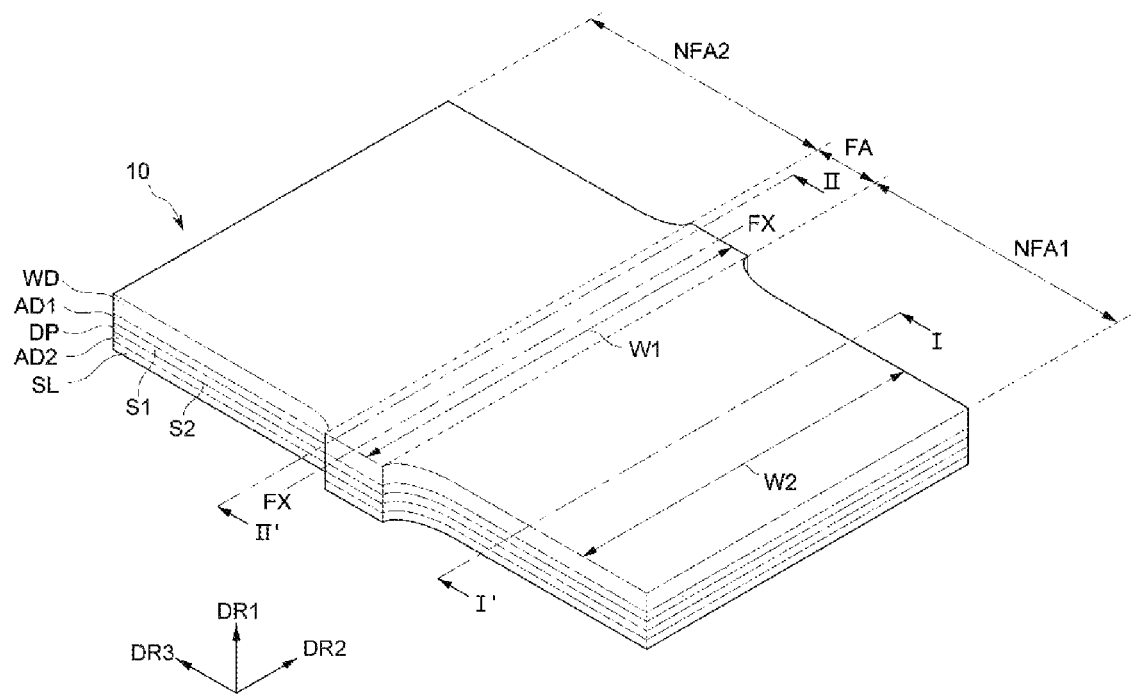
FIG. 2 is a schematic perspective view illustrating a foldable display device according to an embodiment in an unfolded state.
Figure 3:
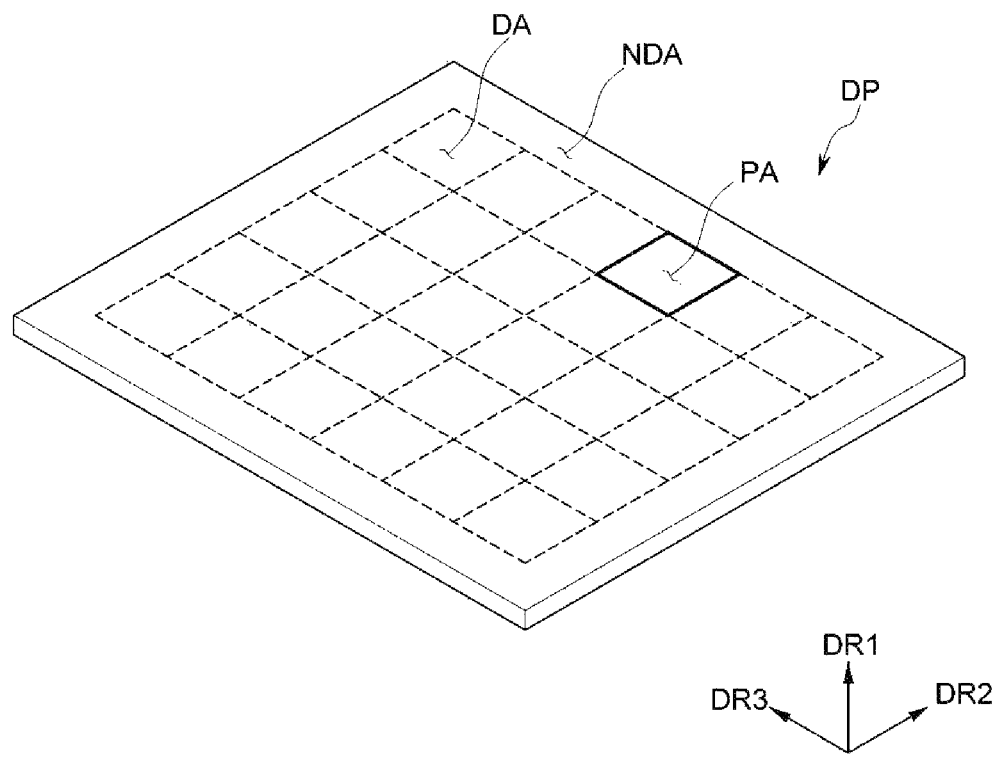
FIG. 3 is a schematic perspective view illustrating a display panel according to an embodiment.

FIG. 1 is a schematic perspective view illustrating a foldable display device 10 according to an embodiment in a folded state, FIG. 2 is a schematic perspective view illustrating a foldable display device 10 according to an embodiment in an unfolded state, and FIG. 3 is a schematic perspective view illustrating a display panel DP according to an embodiment.

Referring to FIGS. 1 and 2, a foldable display device 10 according to an embodiment includes a display panel DP, a window WD disposed adjacent to a first surface S1 (e.g., a front surface in FIG. 2) of the display panel DP, an auxiliary layer SL disposed adjacent to a second surface S2 (e.g., a back surface in FIG. 2) of the display panel DP, a first adhesive layer AD1 disposed between the display panel DP and the window WD, and a second adhesive layer AD2 disposed between the display panel DP and the auxiliary layer SL. The auxiliary layer SL, the second adhesive layer AD2, the display panel DP, the first adhesive layer AD1, and the window WD may be sequentially stacked along a first direction DR1. The foldable display device 10 according to an embodiment may be an integrated display device in which the auxiliary layer SL, the second adhesive layer AD2, the display panel DP, the first adhesive layer AD1, and the window WD are coupled (e.g., bonded) to each other.

The foldable display device 10 according to an embodiment operates in a first mode or a second mode. For example, in the first mode, each of the auxiliary layer SL, the second adhesive layer AD2, the display panel DP, the first adhesive layer AD1, and the window WD may be folded with respect to a folding axis FX that extends in a second direction DR2. On the other hand, in the second mode, each of the auxiliary layer SL, the second adhesive layer AD2, the display panel DP, the first adhesive layer AD1, and the window WD may be unfolded to be flat. In the first mode, the window WD may be located closer (e.g., disposed adjacent) to the folding axis FX than the display panel DP is. That is, in the first mode, the window WD may be located at an innermost position. However, embodiments are not limited thereto, and the window WD may be located at an outermost position in the first mode.

The foldable display device 10 includes a folding area FA and non-folding areas NFA1 and NFA2. The non-folding areas NFA1 and NFA2 may include a first non-folding area NFA1 adjacent to one end of the folding area FA and a second non-folding area NFA2 adjacent to another end of the folding area FA. Although it is described that the foldable display device 10 according to the embodiment includes one folding area FA and two (i.e., first and second) non-folding areas NFA1 and NFA2 located on opposite sides of the folding area FA, embodiments are not limited thereto. In an embodiment, the foldable display device 10 may include two or more folding areas and three or more non-folding areas.

The foldable display device 10 may have a radius of curvature CR (e.g., in the folding area FA when operates in the first mode) in a range from about 0.5 mm to about 10 mm. For example, the foldable display device 10 may have a radius of curvature CR of about 1.5 mm. However, embodiments are not limited thereto, and the radius of curvature CR of the foldable display device 10 may be determined in consideration of, for example, a strength of the display panel DP and a strength of the window WD.

The display panel DP may be a flexible display panel. The display panel DP may include a flexible substrate. As used herein, the term "flexible" refers to a characteristic capable of being bent, and may be understood as including structures from ones that can be completely folded to ones that can be bent at the nanometer level.

The display panel DP may be an organic light emitting display panel. The organic light emitting display panel may be manufactured in a laminated structure of a thin film type (e.g., in a laminated structure of thin films), and may have suitable (e.g., excellent) flexibility. However, embodiments are not limited thereto, and the display panel DP according to an embodiment may be, for example, a liquid crystal display ("LCD") panel, a plasma display panel, an electrophoretic display panel, a microelectromechanical system ("MEMS") display panel, or an electrowetting display panel.

The display panel DP displays images on at least one of the first surface S1 and the second surface S2. For example, the display panel DP may display images on the first surface S1. The display panel DP includes a folding portion DF located at the folding area FA, a first non-folding portion DNF1 located at the first non-folding area NFA1, and a second non-folding portion DNF2 located at the second non-folding area NFA2. The display panel DP generates and displays images irrespective of whether it is the folding portion DF or the first and second non-folding portions DNF1 and DNF2. In other words, the display panel DP generates and displays images in the folding portion DF and the first and second non-folding portions DNF1 and DNF2.

The folding portion DF of the display panel DP is folded with respect to the folding axis FX in the first mode, and unfolded in the second mode. On the other hand, each of the first and second non-folding portions DNF1 and DNF2 of the display panel DP is not folded both in the first mode and the second mode. Each of the first and second non-folding portions DNF1 and DNF2 of the display panel DP may be substantially flat or gently curved in the first mode and the second mode.

It is depicted in FIG. 1 that a distance between the first non-folding portion DNF1 and the second non-folding portion DNF2 of the display panel DP according to an embodiment is uniform with respect to the folding axis FX, but embodiments are not limited thereto. In an embodiment, a distance between the first non-folding portion DNF1 and the second non-folding portion DNF2 that face each other as the display panel DP is folded may not be uniform. In addition, it is depicted that when the display panel DP is folded with respect to the folding axis FX, respective areas of the first non-folding portion DNF1 and the second non-folding portion DNF2 that face each other as the display panel DP is folded are substantially equal to each other, but embodiments are not limited thereto. In an embodiment, the respective areas of the first non-folding portion DNF1 and the second non-folding portion DNF2 that face each other as the display panel DP is folded may be different from each other.

Referring to FIG. 3, the display panel DP according to an embodiment includes a display area DA and a non-display area NDA. The display area DA displays images. The display area DA may have a rectangular shape in a plan view, but embodiments are not limited thereto.

The display area DA includes a plurality of pixel areas PA. For example, the plurality of pixel areas PA may be arranged in a matrix form. Each of the plurality of pixel areas PA includes an organic light emitting diode ("OLED"), and may be defined by a pixel defining layer. In addition, a plurality of wirings and at least one thin film transistor for driving the OLED may be disposed at the plurality of pixel areas PA.

The non-display area NDA does not display images. The non-display area NDA may have a shape that is around (e.g., surrounds) the display area DA in a plan view, but embodiments are not limited thereto.

In addition, although not illustrated, the display panel DP may further include a polarizing layer, a reflective layer, and/or a touch sensing unit.

Referring again to FIGS. 1 and 2, the window WD is disposed on the first surface S1 of the display panel DP. The window WD protects the display panel DP. The window WD includes a folding portion WF located at the folding area FA, a first non-folding portion WNF1 located at the first non-folding area NFA1, and a second non-folding portion WNF2 located at the second non-folding area NFA2.

The folding portion WF of the window WD is folded with respect to the folding axis FX in the first mode, and unfolded in the second mode. On the other hand, each of the first and second non-folding portions WNF1 and WNF2 of the window WD is not folded both in the first mode and the second mode. Each of the first and second non-folding portions WNF1 and WNF2 of the window WD may be substantially flat or gently curved in the first mode and the second mode.

It is depicted in FIG. 1 that a distance between the first non-folding portion WNF1 and the second non-folding portion WNF2 of the window WD according to an embodiment is uniform with respect to the folding axis FX, but embodiments are not limited thereto. In an embodiment, a distance between the first non-folding portion WNF1 and the second non-folding portion WNF2 that face each other as the window WD is folded may not be uniform. In addition, it is depicted that when the window WD is folded with respect to the folding axis FX, respective areas of the first non-folding portion WNF1 and the second non-folding portion WNF2 that face each other as the window WD is folded are substantially equal to each other, but embodiments are not limited thereto. In an embodiment, the respective areas of the first non-folding portion WNF1 and the second non-folding portion WNF2 that face each other as the window WD is folded may be different from each other.

The window WD according to an embodiment includes a transparent tempered glass. Because the window WD that includes glass is better (e.g., more excellent) in strength than a plastic window, the possibility that the foldable display device 10 is broken may be reduced. As used herein, the term "being broken" refers to a state that the window WD may not be utilized according to the intended purpose, due to, e.g., being broken, generation of flaws or cracks, spreading of the flaws or cracks, and/or fracture.

The window WD may have a thickness in a range from about 10 µm to about 100 µm. When the thickness of the window WD exceeds about 100 µm, the repulsive force (e.g., resistance) against deformation (e.g., folding) becomes too large, which makes it difficult to fold the window WD. On the other hand, when the thickness of the window WD is less than about 10 µm, the possibility of window breakage may increase due to the lowering of the strength. However, the thickness of the window WD is desirably (e.g., preferably) to be as small as possible within a range that the strength is suitably secured, and for example, the window WD may have a thickness in a range from about 25 µm to about 50 µm.

The auxiliary layer SL is disposed on the second surface S2 of the display panel DP. The auxiliary layer SL includes a folding portion SF located at the folding area FA, a first non-folding portion SNF1 located at the first non-folding area NFA1, and a second non-folding portion SNF2 located at the second non-folding area NFA2.

The folding portion SF of the auxiliary layer SL is folded with respect to the folding axis FX in the first mode, and unfolded in the second mode. On the other hand, each of the first and second non-folding portions SNF1 and SNF2 of the auxiliary layer SL is not folded both in the first mode and the second mode. Each of the first and second non-folding portions SNF1 and SNF2 of the auxiliary layer SL may be substantially flat or gently curved in the first mode and the second mode.

It is depicted in FIG. 1 that a distance between the first non-folding portion SNF1 and the second non-folding portion SNF2 of the auxiliary layer SL according to an embodiment is uniform with respect to the folding axis FX, but embodiments are not limited thereto. In an embodiment, a distance between the first non-folding portion SNF1 and the second non-folding portion SNF2 that face each other as the auxiliary layer SL is folded may not be uniform. In addition, it is depicted that when the auxiliary layer SL is folded with respect to the folding axis FX, respective areas of the first non-folding portion SNF1 and the second non-folding portion SNF2 that face each other as the auxiliary layer SL is folded are substantially equal to each other, but embodiments are not limited thereto. In an embodiment, the respective areas of the first non-folding portion SNF1 and the second non-folding portion SNF2 that face each other as the auxiliary layer SL is folded may be different from each other.

The auxiliary layer SL may be a flexible film of a thin film kind. The auxiliary layer SL according to an embodiment may be a protective film. The protective film protects the display panel DP from external impact. The protective film may utilize any suitable protective films without limitation as long as it is a suitable (e.g., common) one known in the art. For example, the protective film may be a polyimide film. Further, the auxiliary layer SL may be a functional film capable of imparting or complementing for a specific function. For example, the auxiliary layer SL may be any one of a light blocking film, a reflective film, and a heat dissipation film.

Although it is described that the foldable display device 10 according to an embodiment includes one auxiliary layer SL, embodiments are not limited thereto. In an embodiment, the foldable display device 10 may include a plurality of auxiliary layers SL.

The display panel DP and the window WD are bonded to each other by the first adhesive layer AD1, and the display panel DP and the auxiliary layer SL are bonded to each other by the second adhesive layer AD2. The first and second adhesive layers AD1 and AD2 include folding portions MF and AF located at the folding area FA, first non-folding portions MNF1 and ANF1 located at the first non-folding area NFA1, and second non-folding portions MNF2 and ANF2 located at the second non-folding area NFA2, respectively.

Each of the folding portions MF and AF of the first and second adhesive layers AD1 and AD2 is folded with respect to the folding axis FX in the first mode, and unfolded in the second mode. On the other hand, each of the first and second non-folding portions MNF1, MNF2, ANF1, and ANF2 of the first and second adhesive layers AD1 and AD2 is not folded both in the first mode and the second mode. Each of the first and second non-folding portions MNF1, MNF2, ANF1, and ANF2 of the first and second adhesive layers AD1 and AD2 may be substantially flat or gently curved in the first mode and the second mode.

It is depicted in FIG. 1 that each distance between corresponding ones of the first non-folding portions MNF1 and ANF1 and the second non-folding portions MNF2 and ANF2 of the first and second adhesive layers AD1 and AD2 according to an embodiment is uniform with respect to the folding axis FX, but embodiments are not limited thereto. In an embodiment, each distance between corresponding ones of the first non-folding portions MNF1 and ANF1 and the second non-folding portions MNF2 and ANF2 that face each other, respectively, as the first and second adhesive layers AD1 and AD2 are folded may not be uniform. In addition, it is depicted that respective areas of corresponding ones of the first non-folding portions MNF1 and ANF1 and the second non-folding portions MNF2 and ANF2 that face each other, respectively, as the first and second adhesive layers AD1 and AD2 are folded are substantially equal to each other, but embodiments are not limited thereto. In an embodiment, the respective areas of corresponding ones of the first non-folding portions MNF1 and ANF1 and the second non-folding portions MNF2 and ANF2 that face each other, respectively, as the first and second adhesive layers AD1 and AD2 are folded may be different from each other.

Each of the first and second adhesive layers AD1 and AD2 may be a double-sided adhesive. Each of the first and second adhesive layers AD1 and AD2 may be a pressure sensitive adhesive sheet ("PSA"). The first and second adhesive layers AD1 and AD2 may be flexible.

According to the embodiment, a width of the foldable display device 10 at the folding area FA is greater than a width of the foldable display device 10 at the first and second folding areas NFA1 and NFA2. In particular, a width W1 of the window WD at the folding area FA is greater than a width W2 of the window WD at the first and second non-folding areas NFA1 and NFA2. For example, as illustrated in FIGS. 1 and 2, when a width of the folding portion WF of the window WD is defined as a first width W1, and a width of the first non-folding portion WNF1 of the window WD is defined as a second width W2, the first width W1 is greater than the second width W2. The width of the window WD is the length in the direction of the folding axis FX.

According to an embodiment, the foldable display device 10 has opposite side surfaces that are perpendicular to the folding axis FX and oppose each other. In such an embodiment, opposite side surfaces (NCS in FIG. 5) of the foldable display device 10 at the folding area FA are uncut surfaces, and opposite side surfaces (CS in FIG. 4) of the foldable display device 10 at the first and second non-folding areas NFA1 and NFA2 that extend from the respective opposite side surfaces at the folding area FA are cut surfaces.

Accordingly, in the foldable display device 10 according to the embodiment, a breaking strength (e.g., resistance to breaking) at the folding area FA is greater than a breaking strength (e.g., resistance to breaking) at the first and second non-folding areas NFA1 and NFA2, which will be described in more detail below.

Figure 4:
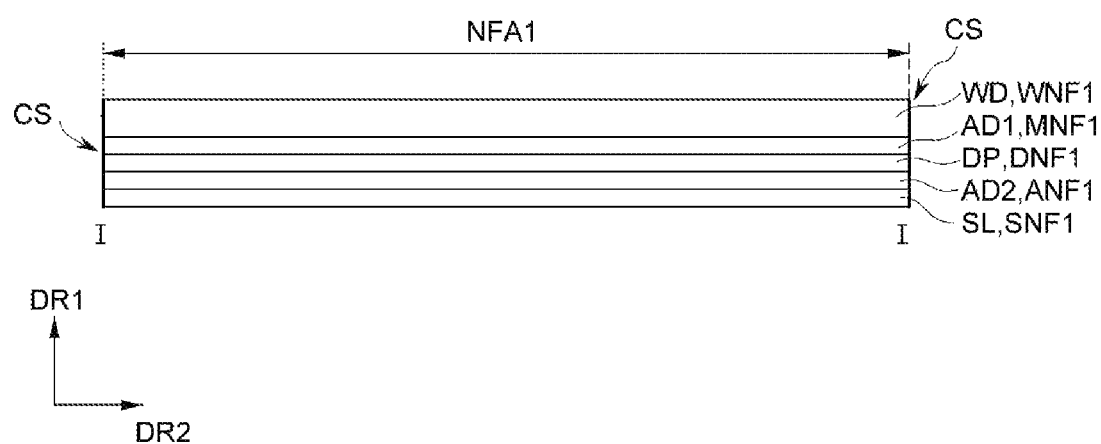
FIG. 4 is a cross-sectional view taken along the line I-I' of FIG. 2.
Figure 5:
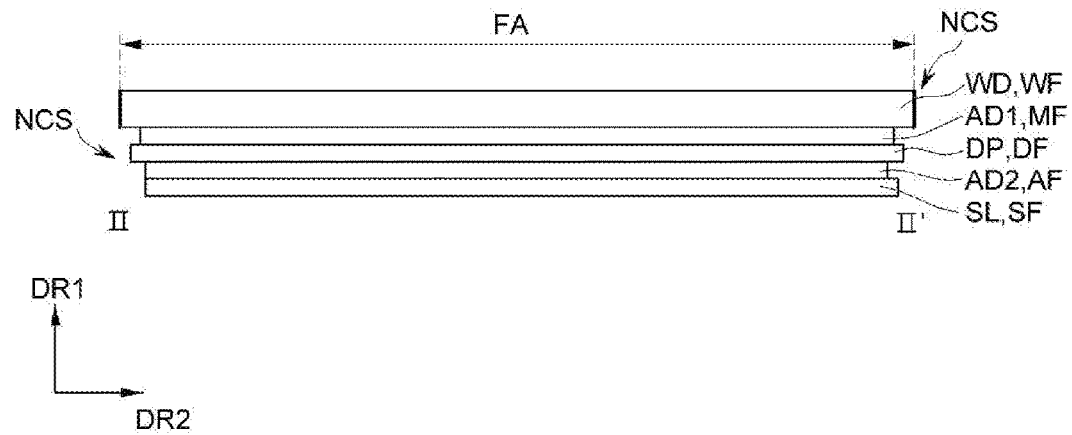
FIG. 5 is a cross-sectional view taken along the line II-II' of FIG. 2.

FIG. 4 is a cross-sectional view taken along the line I-I' of FIG. 2, and FIG. 5 is a cross-sectional view taken along the line II-II' of FIG. 2. In particular, FIG. 4 is a cross-sectional view illustrating the first non-folding area NFA1 of the foldable display device 10 according to the embodiment, and FIG. 5 is a cross-sectional view illustrating the folding area FA of the foldable display device 10 according to the embodiment.

Referring to FIGS. 4 and 5, the foldable display device 10 according to an embodiment includes opposite side surfaces CS and NCS that oppose (e.g., face) each other in the second direction DR2. That is, each of the opposite side surfaces CS and NCS may be perpendicular to the folding axis FX and positioned opposite each other.

Specifically, as illustrated in FIG. 4, the opposite side surfaces CS at the first non-folding area NFA1 according to an embodiment have a flat planar shape. On the other hand, as illustrated in FIG. 5, each of the opposite side surfaces NCS at the folding area FA has a step difference. For example, at the folding area FA, one side surface of the window WD may generate a step difference with at least one of the respective side surfaces of the display panel DP, the auxiliary layer SL, the first adhesive layer AD1, and the second adhesive layer AD2.

According to an embodiment, as illustrated in FIG. 4, at the first non-folding area NFA1, respective widths of the auxiliary layer SL, the second adhesive layer AD2, the display panel DP, the first adhesive layer AD1, and the window WD may be substantially equal to each other. On the other hand, as illustrated in FIG. 5, at the folding area FA, respective widths of the auxiliary layer SL, the second adhesive layer AD2, the display panel DP, the first adhesive layer AD1, and the window WD may be substantially equal to or different from each other.

In this embodiment, the opposite side surfaces CS at the first non-folding area NFA1 are cut surfaces on which a cutting process is performed after a bonding process of the auxiliary layer SL, the second adhesive layer AD2, the display panel DP, the first adhesive layer AD1, and the window WD. On the other hand, the opposite side surfaces NCS at the folding area FA are uncut surfaces that have not been subjected to a cutting process after the bonding process of the auxiliary layer SL, the second adhesive layer AD2, the display panel DP, the first adhesive layer AD1, and the window WD, which will be described in more detail along with the manufacturing method.

Figure 6:
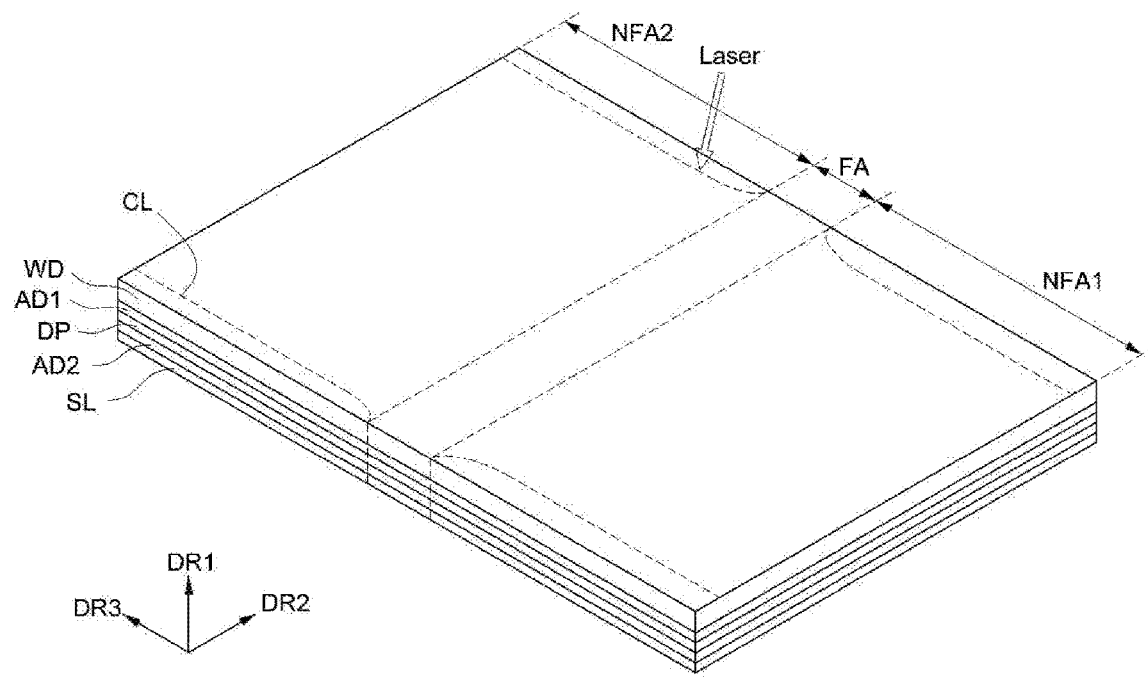
FIG. 6 is a perspective view illustrating a method of manufacturing a foldable display device according to an embodiment.

FIG. 6 is a perspective view illustrating a method of manufacturing a foldable display device 10 according to an embodiment.

First, the display panel DP that includes the folding area FA and the non-folding areas NFA1 and NFA2, and includes the first surface S1 and the second surface S2, opposite each other, is prepared. Next, the window WD is coupled on the first surface S1 of the display panel DP utilizing the first adhesive layer AD1, and the auxiliary layer SL is coupled on the second surface S2 of the display panel DP utilizing the second adhesive layer AD2. Coupling between the display panel DP and the window WD, and between the display panel DP and the auxiliary layer SL may be carried out through a bonding process such as a laminating process. However, embodiments are not limited thereto, and coupling may be carried out through various suitable (e.g., known) bonding processes.

Referring to FIG. 6, the auxiliary layer SL, the second adhesive layer AD2, the display panel DP, the first adhesive layer AD1, and the window WD that are integrally coupled to each other may be cut at a time (e.g., simultaneously or concurrently). For example, the auxiliary layer SL, the second adhesive layer AD2, the display panel DP, the first adhesive layer AD1, and the window WD that are integrally coupled to each other may be cut at a time (e.g., simultaneously or concurrently) by utilizing laser. However, embodiments are not limited thereto, and the auxiliary layer SL, the second adhesive layer AD2, the display panel DP, the first adhesive layer AD1, and the window WD that are integrally coupled to each other may be cut at a time (e.g., simultaneously or concurrently) through a knife cutting process utilizing a knife.

For example, in the cutting process according to an embodiment, the auxiliary layer SL, the second adhesive layer AD2, the display panel DP, the first adhesive layer AD1, and the window WD that are located at the first and second non-folding areas NFA1 and NFA2 are cut at a time (e.g., simultaneously or concurrently). On the other hand, the auxiliary layer SL, the second adhesive layer AD2, the display panel DP, the first adhesive layer AD1, and the window WD that are located at the fording area FA are not cut. Accordingly, opposite side surfaces of the foldable display device 10 at the folding area FA are uncut surfaces, and opposite side surfaces thereof at the first and second folding areas NFA1 and NFA2 that extend from the respective opposite side surfaces at the folding area FA are cut surfaces.

In the process of bonding the auxiliary layer SL, the second adhesive layer AD2, the display panel DP, the first adhesive layer AD1, and the window WD that constitute the foldable display device 10, respective side surfaces thereof are not completely aligned with each other, and thus a step difference may be generated at interfaces between adjacent layers. Accordingly, in order to remove such a step difference generated at a side surface of the foldable display device 10, a cutting process may be performed after the bonding process. In a case where the cutting process is performed, respective side surfaces of the auxiliary layer SL, the second adhesive layer AD2, the display panel DP, the first adhesive layer AD1, and the window WD may be located on substantially the same flat plane or substantially the same curved plane. In addition, in a case where the cutting process is performed, a dead space of the foldable display device 10 may be reduced.

The folding area FA of the foldable display device 10 corresponds to a portion which is folded or unfolded according to the operation mode, and thus the folding area FA requires a relatively high mechanical strength, as compared to the first and second non-folding areas NFA1 and NFA2 that maintain a constant shape regardless of the operation mode. However, when the foldable display device 10 includes the window including (e.g., made of) a tempered glass, the strength of the foldable display device 10 may be lowered.

In the foldable display device 10 according to an embodiment, because the auxiliary layer SL, the second adhesive layer AD2, the display panel DP, the first adhesive layer AD1, and the window WD that are located at the first and second non-folding areas NFA1 and NFA2 are cut at a time (e.g., simultaneously or concurrently), a step difference that may have been generated in the bonding process may be removed, and a dead space of the foldable display device 10 may be reduced. Accordingly, as illustrated in FIG. 4, respective side surfaces of the auxiliary layer SL, the second adhesive layer AD2, the display panel DP, the first adhesive layer AD1, and the window WD are disposed on substantially the same plane at the first non-folding area NFA1, and thus, an integrated display panel whose side surface is substantially flat may be manufactured. As used herein, the term "substantially the same" may not only refer to "completely the same," but also refer to "similar" or "proximate" within a range that permits a certain degree of error margin due to process conditions and material characteristics, for example. In addition, the phrase that the respective side surfaces of the auxiliary layer SL, the second adhesive layer AD2, the display panel DP, the first adhesive layer AD1, and the window WD are disposed on substantially the same plane includes a case where the side surfaces thereof are completely aligned with each other, and may be comprehensively understood that no abrupt step is generated at the interfaces between them.

According to an embodiment, because the auxiliary layer SL, the second adhesive layer AD2, the display panel DP, the first adhesive layer AD1, and the window WD of the foldable display device 10 that are located at the folding area FA are not cut, the strength of the folding area FA may be sufficiently secured. Accordingly, a breaking strength of the foldable display device 10 according to the embodiment at the folding area FA is greater than a breaking strength of the foldable display device 10 at the non-folding areas NFA1 and NFA2. For example, the breaking strength of the foldable display device 10 at the folding area FA may be in a range from about 1 GPa to about 100 GPa, and the breaking strength of the foldable display device 10 at the non-folding areas NFA1 and NFA2 may be in a range from about 100 MPa to about 1 GPa.

Hereinafter, other embodiments will be described with reference to FIGS. 7 and 8. The description of the same configuration as that of an embodiment of the present invention will not be repeated for the convenience of explanation.

Figure 7:
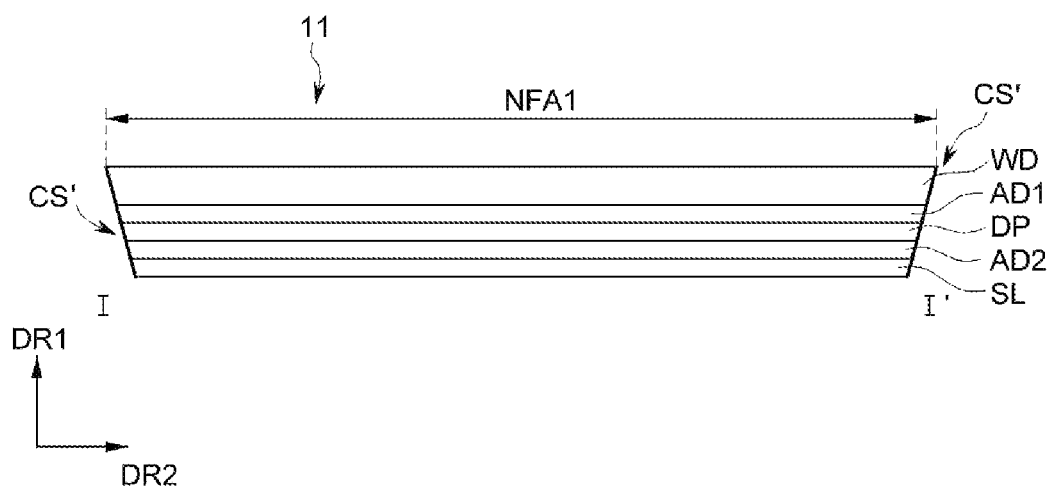
FIG. 7 is a cross-sectional view illustrating a foldable display device according to another embodiment.
Figure 8:
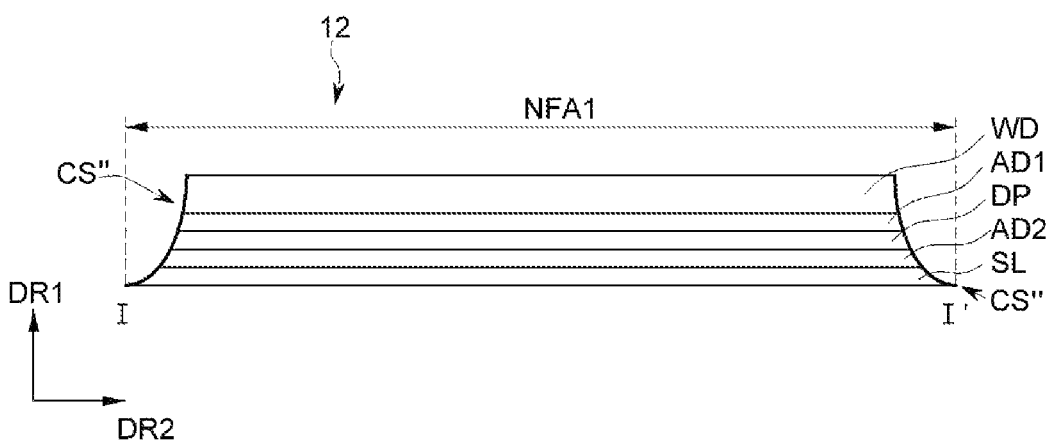
FIG. 8 is a cross-sectional view illustrating a foldable display device according to still another embodiment.

FIG. 7 is a cross-sectional view illustrating a foldable display device 11 according to another embodiment, and FIG. 8 is a cross-sectional view illustrating a foldable display device 12 according to still another embodiment. In this case, FIGS. 7 and 8 are cross-sectional views corresponding to the line I-I' of FIG. 2.

Referring to FIG. 7, each of opposite side surfaces CS' of the foldable display device 11 according to another embodiment at the first non-folding area NFA1 may have a shape of a flat inclined surface. In such an embodiment, the opposite side surfaces CS' may be cut surfaces on which the auxiliary layer SL, the second adhesive layer AD2, the display panel DP, the first adhesive layer AD1, and the window WD are cut at a time (e.g., simultaneously or concurrently).

The foldable display device 11 includes the auxiliary layer SL, the second adhesive layer AD2, the display panel DP, the first adhesive layer AD1, and the window WD that are sequentially arranged along the first direction DR1. Although it is depicted in FIG. 7 that respective widths of the auxiliary layer SL, the second adhesive layer AD2, the display panel DP, the first adhesive layer AD1, and the window WD according to another embodiment increase along the first direction DR1, embodiments are not limited thereto. In an embodiment, the respective widths of the auxiliary layer SL, the second adhesive layer AD2, the display panel DP, the first adhesive layer AD1, and the window WD according to another embodiment may decrease along the first direction DR1.

According to another embodiment, a step difference that may be generated in the bonding process may be removed, and a dead space of the foldable display device 11 may be reduced. Accordingly, respective side surfaces of the auxiliary layer SL, the second adhesive layer AD2, the display panel DP, the first adhesive layer AD1, and the window WD may be located on substantially the same flat surface at the first non-folding area NFA1, and thus an integrated display panel whose side surface is continuous (e.g., smooth) may be manufactured.

Referring to FIG. 8, each of opposite side surfaces CS" of the foldable display device 12 according to still another embodiment at the first non-folding area NFA1 may have a shape of a curved surface. In such an embodiment, the opposite side surfaces CS" may be cut surfaces on which the auxiliary layer SL, the second adhesive layer AD2, the display panel DP, the first adhesive layer AD1, and the window WD are cut at a time (e.g., simultaneously or concurrently).

The foldable display device 12 includes the auxiliary layer SL, the second adhesive layer AD2, the display panel DP, the first adhesive layer AD1, and the window WD that are sequentially arranged along the first direction DR1. Although it is depicted in FIG. 8 that respective widths of the auxiliary layer SL, the second adhesive layer AD2, the display panel DP, the first adhesive layer AD1, and the window WD according to still another embodiment decrease along the first direction DR1, embodiments are not limited thereto. In an embodiment, the respective widths of the auxiliary layer SL, the second adhesive layer AD2, the display panel DP, the first adhesive layer AD1, and the window WD according to still another embodiment may increase along the first direction DR1.

According to still another embodiment of the present invention, a step difference that may be generated in the bonding process may be removed, and a dead space of the foldable display device 12 may be reduced. Accordingly, respective side surfaces of the auxiliary layer SL, the second adhesive layer AD2, the display panel DP, the first adhesive layer AD1, and the window WD may be located on substantially the same curved surface at the first non-folding area NFA1, and thus an integrated display panel whose side surface is continuous (e.g., smooth) may be manufactured.

Hereinafter, other embodiments will be described with reference to FIGS. 9 and 10. The description of the same configuration as that of an embodiment of the present invention will not be repeated for the convenience of explanation.

Figure 9:
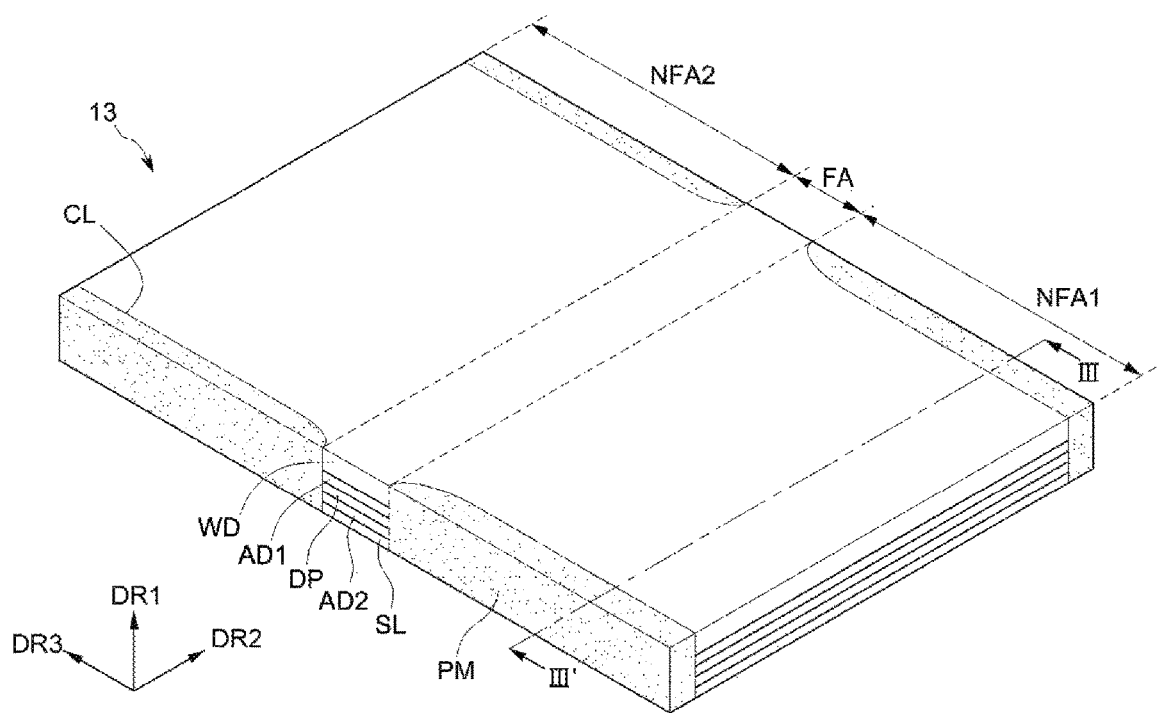
FIG. 9 is a schematic perspective view illustrating a foldable display device according to still another embodiment in an unfolded state.
Figure 10:
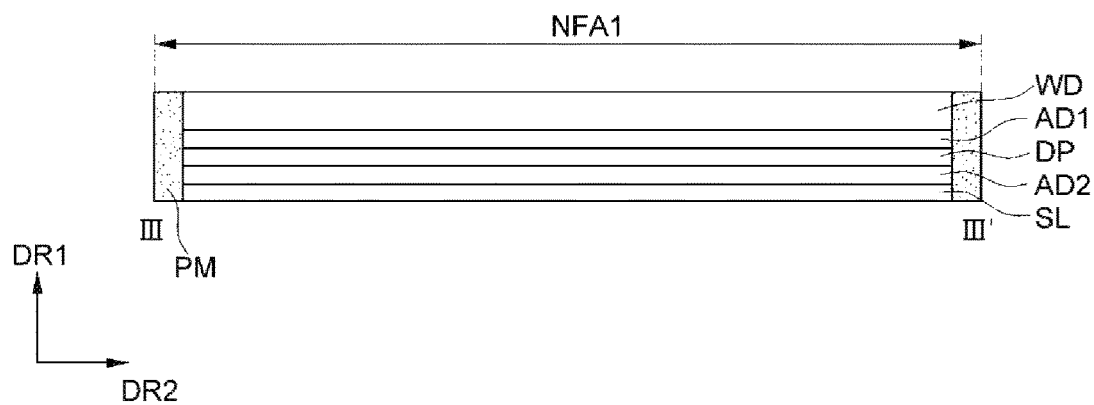
FIG. 10 is a cross-sectional view taken along the line III-III' of FIG. 9.

FIG. 9 is a schematic perspective view illustrating a foldable display device 13 according to still another embodiment in an unfolded state, and FIG. 10 is a cross-sectional view taken along the line III-III' of FIG. 9.

Referring to FIGS. 9 and 10, the foldable display device 13 according to still another embodiment further includes a reinforcing member PM disposed at opposite side surfaces CS of the foldable display device 13 at the first and second non-folding areas NFA1 and NFA2. In such an embodiment, the opposite side surfaces CS at the first non-folding area NFA1 are cut surfaces on which a cutting process is performed after a bonding process of the auxiliary layer SL, the second adhesive layer AD2, the display panel DP, the first adhesive layer AD1, and the window WD. That is, the reinforcing member PM may be provided to cover the respective cut surfaces of the auxiliary layer SL, the second adhesive layer AD2, the display panel DP, the first adhesive layer AD1, and the window WD.

The reinforcing member PM may compensate for tapering and/or a volume loss that may occur at the cut surface. The reinforcing member PM may include a curable resin, but embodiments are not limited thereto. According to the present embodiment, the reinforcing member PM is not disposed at the folding area FA. That is, the reinforcing member PM does not contact the uncut surface of the folding area FA. Accordingly, the foldable display device 13 may secure sufficient flexible characteristics at the folding area FA.

As the foldable display device 13 according to still another embodiment further includes the reinforcing member PM disposed at the first and second non-folding areas NFA1 and NFA2, a strength of the side surface of the foldable display device 13 may be compensated (e.g., reinforced) and durability thereof may be improved overall.

As set forth hereinabove, the foldable display device according to one or more embodiments may improve the strength of the foldable display device by including a folding area that does not include a cut surface and a non-folding area that includes a cut surface.

While the present invention has been illustrated and described with reference to the embodiments thereof, it will be apparent to those of ordinary skill in the art that various changes in form and detail may be made thereto without departing from the spirit and scope of the present invention, and equivalents thereof.

What is claimed is:

1. A foldable display device comprising:
 a display panel comprising a folding area and a non-folding area, the display panel having a front surface to display an image and a back surface facing oppositely away from the front surface;
 a window adjacent the front surface of the display panel, the entire window being a glass to display the image;
 an auxiliary layer adjacent the back surface of the display panel;
 a first adhesive layer between the display panel and the window; and
 a second adhesive layer between the display panel and the auxiliary layer,
 wherein when the foldable display device is unfolded,
  the window has a front surface parallel to the front surface of the display panel,
  an entire perimeter of the front surface of the window comprises a first pair of sides extending in a first direction and opposite each other and a second pair of sides extending in a second direction and opposite each other and having a width longer than a width of the first pair of sides when viewed from above the front surface of the display panel,
  on the front surface of the window, a width of the window at the folding area in the first direction is greater than a width of the window at the non-folding area in the first direction, and
  on the front surface of the window, at least one of the second pair of sides of the window includes a protruding portion protruding in the first direction in the folding area.

2. The foldable display device of claim 1, wherein a breaking strength at the folding area is greater than a breaking strength at the non-folding area.

3. The foldable display device of claim 2, wherein the breaking strength at the folding area is in a range from about 1 Gpa to about 100 Gpa, and the breaking strength at the non-folding area is in a range from about 100 MPa to about 1 Gpa.

4. The foldable display device of claim 1, further comprising two opposite side surfaces along the second pair of sides and opposite each other;
 wherein the two opposite side surfaces at the folding area are uncut surfaces, and the two opposite side surfaces at the non-folding area are cut surfaces.

5. The foldable display device of claim 4, wherein at least one side surface of the two opposite side surfaces at the folding area has a step difference.

6. The foldable display device of claim 4, wherein the two opposite side surfaces at the non-folding area are flat surfaces.

7. The foldable display device of claim 6, wherein respective widths of the display panel, the window, the auxiliary layer, the first adhesive layer, and the second adhesive layer at the non-folding area are substantially equal to each other.

8. The foldable display device of claim 4, wherein the two opposite side surfaces at the non-folding area are curved surfaces.

9. The foldable display device of claim 4, further comprising a reinforcing member at the cut surfaces.

10. The foldable display device of claim 9, wherein the reinforcing member does not contact the uncut surfaces.

11. The foldable display device of claim 1, wherein the window comprises a tempered glass having a thickness in a range from about 10 μm to about 100 μm.

12. The foldable display device of claim 1, wherein the auxiliary layer comprises any one of a protective film, a light blocking film, a reflective film, and a heat dissipation film.

13. The foldable display device of claim 1, wherein when the foldable display device is unfolded, at least one of two opposite side surfaces of the window along the second pair of sides includes a protruding portion.

14. The foldable display device of claim 1, wherein the front surface of the window is opposite to a back surface of the window which faces the front surface of the display panel.

15. A foldable display device comprising:
a display panel comprising a folding area and a non-folding area, the display panel having a front surface to display an image and a back surface facing oppositely away from the front surface,
a window adjacent the front surface of the display panel, the entire window being a glass to display the image;
an auxiliary layer adjacent the back surface of the display panel;
a first adhesive layer between the display panel and the window; and
a second adhesive layer between the display panel and the auxiliary layer,
wherein the window comprises two opposite side surfaces that are perpendicular to a folding axis and opposite each other,
the two opposite side surfaces at the folding area are uncut surfaces, and the two opposite side surfaces at the non-folding area are cut surfaces, and
when the foldable display device is unfolded,
the window has a front surface parallel to the front surface of the display panel,
an entire perimeter of the front surface of the window comprises a first pair of sides extending in a first direction and opposite each other and a second pair of sides extending in a second direction and opposite each other and having a width longer than a width of the first pair of sides when viewed from above the front surface of the display panel, and
on the front surface of the window, a distance in the first direction between the second pair of sides at the folding area is greater than a distance in the first direction between the second pair of sides at the non-folding area, and
on the front surface of the window, at least one of the second pair of sides of the window includes a protruding portion protruding in the first direction in the folding area.

16. The foldable display device of claim 15, wherein a width of the window at the folding area is greater than a width of the window at the non-folding area.

17. The foldable display device of claim 15, wherein a breaking strength at the folding area is greater than a breaking strength at the non-folding area.

18. The foldable display device of claim 17, wherein the breaking strength at the folding area is in a range from about 1 Gpa to about 100 Gpa, and the breaking strength at the non-folding area is in a range from about 100 MPa to about 1 Gpa.

19. The foldable display device of claim 15, wherein the window comprises a tempered glass having a thickness in a range from about 10 μm to about 100 μm.

* * * * *